United States Patent
Homma

(10) Patent No.: US 7,141,878 B2
(45) Date of Patent: Nov. 28, 2006

(54) SEMICONDUCTOR DEVICE AND MANUFACTURING METHOD THEREOF

(75) Inventor: Soichi Homma, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/060,384

(22) Filed: Feb. 17, 2005

(65) Prior Publication Data

US 2005/0179131 A1    Aug. 18, 2005

(30) Foreign Application Priority Data

Feb. 18, 2004    (JP)    ............................ P2004-041174

(51) Int. Cl.
*H01L 23/48*    (2006.01)

(52) U.S. Cl. ............... 257/738; 257/778; 257/E21.503; 257/E21.508

(58) Field of Classification Search ................ 257/711, 257/734, 737, 738, 772, 777, 778, 779, 782, 257/E21.503, E21.508, E21.511; 438/108, 438/106, 612, 613
See application file for complete search history.

(56) References Cited

U.S. PATENT DOCUMENTS

| | | | | |
|---|---|---|---|---|
| 5,629,566 | A | * | 5/1997 | Doi et al. .................. 257/789 |
| 5,864,178 | A | * | 1/1999 | Yamada et al. ............. 257/737 |
| 6,111,317 | A | | 8/2000 | Okada et al. |
| 6,528,881 | B1 | | 3/2003 | Tsuboi |
| 6,614,113 | B1 | | 9/2003 | Watanabe et al. |
| 2003/0003011 | A1 | * | 1/2003 | Kato et al. .................. 420/560 |
| 2003/0013291 | A1 | * | 1/2003 | Chen et al. ................. 438/613 |

FOREIGN PATENT DOCUMENTS

| | | |
|---|---|---|
| JP | 08-045938 | 2/1996 |
| JP | 09-205096 | 8/1997 |
| JP | 10-116860 | 5/1998 |
| JP | 2001-093928 | 4/2001 |
| JP | 2003-068740 | 3/2003 |
| JP | 2003-243569 | 8/2003 |

OTHER PUBLICATIONS

English-language translation of Official Communication from the Japanese Patent Office in counterpart application, mailed Apr. 18, 2006.

* cited by examiner

*Primary Examiner*—Brook Kebede
(74) *Attorney, Agent, or Firm*—Finnegan, Henderson, Farabow, Garrett & Dunner, L.L.P.

(57) ABSTRACT

A semiconductor device is comprised of a semiconductor element having a low dielectric constant insulating film, first electrode pads and barrier metal layers; and a substrate having second electrode pads corresponding to the first electrode pads. The first electrode pads and the second electrode pads are connected via metal bumps. The barrier metal layers having a thickness in a range of 0.1 to 3 μm are interposed between the metal bumps and the first electrode pads. Besides, when it is assumed that the barrier metal layers have a diameter $D_1$, the second electrode pads have an opening diameter $D_2$ and the metal bumps have a minimum pitch p, the diameter $D_1$ of the barrier metal layers satisfies at least one of conditions of $D_1 \geq D_2$ and $D_1 = 0.4$ p to 0.7 p. Thus, the occurrence of a crack, peeling or the like due to the low dielectric constant insulating films can be retarded.

11 Claims, 4 Drawing Sheets

SEMICONDUCTOR DEVICE AND MANUFACTURING METHOD THEREOF

CROSS REFERENCE TO RELATED APPLICATION

This application is based upon and claims the benefit of priority from the prior Japanese Patent Application No. 2004-041174 filed on Feb. 18, 2004; the entire contents of which are incorporated herein by reference.

BACKGROUND

1. Field of the Invention

The present invention relates to a semiconductor device, which applies flip-chip connection, and a manufacturing method of the same.

2. Description of the Related Art

In recent years, the flip-chip connection is being used as a mounting method involving a short connection length of wiring to comply with a trend of multiplication of pins, a provision of a finer pitch, speeding up of a signal speed, high heat generation and the like of a semiconductor element (e.g., Japanese Patent Laid-Open Applications No. HEI 8-45938, No. HEI 9-205096 and No. 2001-93928). The semiconductor element used for the flip-chip connection has, for example, electrode pads which are formed to have an area shape and metal bumps such as solder bumps which are formed on the electrode pads. Meanwhile, a substrate on which the semiconductor element is mounted has electrode pads which are formed in position corresponding to the electrode pads of the semiconductor element.

The flip-chip connection is a method of connecting the semiconductor element and the electrode pads of the substrate by aligning the semiconductor element and the electrode pads of the substrate and heating to melt the solder bumps. Generally, a flux agent is coated onto the substrate or the semiconductor element to reduce the oxide film of the solder bumps and mounting the semiconductor element in position on the substrate by means of a bonder. Then, the solder bumps are connected by heating to melt in a reflow furnace. The flux agent is washed, a resin agent is filled and cured in the gap between the substrate and the semiconductor element to seal them. Thus, the flip-chip connection is completed by through above steps.

To comply with the semiconductor element which is being made to have a finer pitch and additional speeding up, application of Cu wiring which realizes lowering of resistance of wires and an insulator film (low-k film) with a low dielectric constant, which decreases capacitance between wires, is being proceeded (e.g., Japanese Patent Laid-Open Application No. 2003-68740). As a material (low-k material) configuring a low dielectric constant insulating film, it is being studied to use, for example, silicon oxide (SiOF) doped with fluorine, silicon oxide (SiOC) doped with carbon, organic silica, a porous body of them, or the like. But, the low-k material has a drawback that it is poor in mechanical strength and adhesion strength. Therefore, a crack, peeling or the like occurs easily in the low-k film itself or the interface in the flip-chip connection step.

The cause of the crack or peeling occurring in the low-k film or its interface includes a difference in thermal expansion coefficient between the semiconductor element and the substrate in the step of heating to melt the solder bumps. Specifically, the semiconductor element has a thermal expansion coefficient of about 3 ppm, while the substrate has a thermal expansion coefficient larger than that of the semiconductor element, and particularly a resin-based substrate has a thermal expansion coefficient of 10 ppm or more. Such a difference in thermal expansion coefficient results in deformation of the solder bumps in the step of heating to melt the solder bumps and the subsequent cooling step. Generally, the deformation of the solder bumps does not disturb the connection because the pads have a large diameter of about 100 μm and a self-align effect or the like also acts on it.

But, the low-k film is poor in mechanical strength and adhesion strength, so that a crack, peeling or the like is easily caused by a stress produced because of deformation or the like of the solder bumps. Thus, the semiconductor element to which the low-k film is applied is effective to have fine pitched wiring, speeding up and the like but has a drawback that a crack, peeling or the like occurs easily because the low-k film is poor in mechanical strength and adhesion strength. Such a crack, peeling or the like because of the low-k film is a cause of degrading the production yield and reliability of the semiconductor device which applies the flip-chip connection.

Besides, a general Sn—Pb solder was often used for the solder bumps which are used for the flip-chip mounting. But, it is now demanded to decrease the used amount of lead (Pb), which is worried about its load on the environment and effects on the human body, in various types of fields. Therefore, the application of a solder material not containing Pb, e.g., Sn—Ag type solder, Sn—Bi type solder or the like, is also being expanded in the field of electronic parts. But, a solder material (Pb-free solder) not containing Pb has a melting point higher than that of the Sn—Pb solder and a stress based on a temperature difference between a heating-to-melt temperature and a cooling-to-cure temperature increases. Therefore, the occurrence of a crack, peeling or the like because of the low-k film becomes more conspicuous. In addition, the Pb-free solder may be harder than the Sn—Pb solder, and a stress easing effect by the solder bumps becomes low. This point is also a cause of increasing a rate of incidence of a crack, peeling or the like of the low-k film.

SUMMARY

Under the circumstances described above, the present invention provides a semiconductor device and a manufacturing method of the same which realize an element structure and a connection structure capable of retarding the occurrence of a crack, peeling or the like resulting from a low dielectric constant insulating film which is low in mechanical strength and adhesion strength so to improve a production yield in a step of connecting a semiconductor element having a low dielectric constant insulating film and a substrate as well as the reliability of the connection point.

According to an aspect of the present invention, there is provided a semiconductor device, comprising a semiconductor element having an element body with a low dielectric constant insulating film, first electrode pads disposed on the element body, and barrier metal layers formed on the first electrode pads and having a thickness in a range of 0.1 to 3 μm; metal bumps connected to the first electrode pads via the barrier metal layers; and a substrate having second electrode pads which are connected to the first electrode pads via the metal bumps.

According to another aspect of the present invention, there is provided a semiconductor device, comprising a semiconductor element having an element body with a low dielectric constant insulating film, first electrode pads disposed on the element body, and barrier metal layers formed on the first electrode pads; metal bumps connected to the first electrode pads via the barrier metal layers; and a substrate having second electrode pads which are connected to the first electrode pads via the metal bumps, wherein when the barrier metal layers have a diameter $D_1$ and the second electrode pads have an opening diameter $D_2$, the barrier metal layers have the diameter $D_1$ satisfying a relationship of $D_1 \geq D_2$.

According to still another aspect of the present invention, there is provided a semiconductor device, comprising a semiconductor element having an element body with a low dielectric constant insulating film, first electrode pads disposed on the element body, and barrier metal layers formed on the first electrode pads; metal bumps connected to the first electrode pads via the barrier metal layers; and a substrate having second electrode pads which are connected to the first electrode pads via the metal bumps, wherein when the barrier metal layers have a diameter $D_1$ and the metal bumps have a minimum pitch p, the barrier metal layers have the diameter $D_1$ satisfying a relationship of $D_1 = 0.4$ p to 0.7 p.

According to another aspect of the present invention, there is provided a method of manufacturing a semiconductor device, comprising forming sequentially first electrode pads and barrier metal layers having a thickness in a range of 0.1 to 3 µm on a semiconductor element having a low dielectric constant insulating film; forming metal bumps on the barrier metal layers of the semiconductor element or on second electrode pads corresponding to the first electrode pads of a substrate; aligning the semiconductor element and the substrate via the metal bumps to oppose the first electrode pads and the second electrode pads; and heating to melt the metal bumps to connect the first electrode pads of the semiconductor element and the second electrode pads of the substrate via the metal bumps.

According to still another aspect of the present invention, there is provided a method of manufacturing a semiconductor device, comprising forming sequentially first electrode pads and barrier metal layers on a semiconductor element having a low dielectric constant insulating film; forming metal bumps on the barrier metal layers of the semiconductor element or on second electrode pads corresponding to the first electrode pads of a substrate; aligning the semiconductor element and the substrate via the metal bumps to oppose the first electrode pads and the second electrode pads; and heating to melt the metal bumps to connect the first electrode pads of the semiconductor element and the second electrode pads of the substrate via the metal bumps, wherein when the barrier metal layers have a diameter $D_1$, the second electrode pads have an opening diameter $D_2$ and the metal bumps have a minimum pitch p, the barrier metal layers have the diameter $D_1$ satisfying at least one of relationships of $D_1 \geq D_2$ and $D_1 = 0.4$ p to 0.7 p.

BRIEF DESCRIPTION OF THE DRAWINGS

The present invention is described with reference to the drawings, which are provided for illustration only and do not limit the present invention in any respect.

DETAILED DESCRIPTION

Modes of conducting the present invention will be described with reference to the drawings. Embodiments of the present invention are described with reference to the drawings, which are provided for illustration only, and the present invention is not limited to the drawings.

Figure 1:
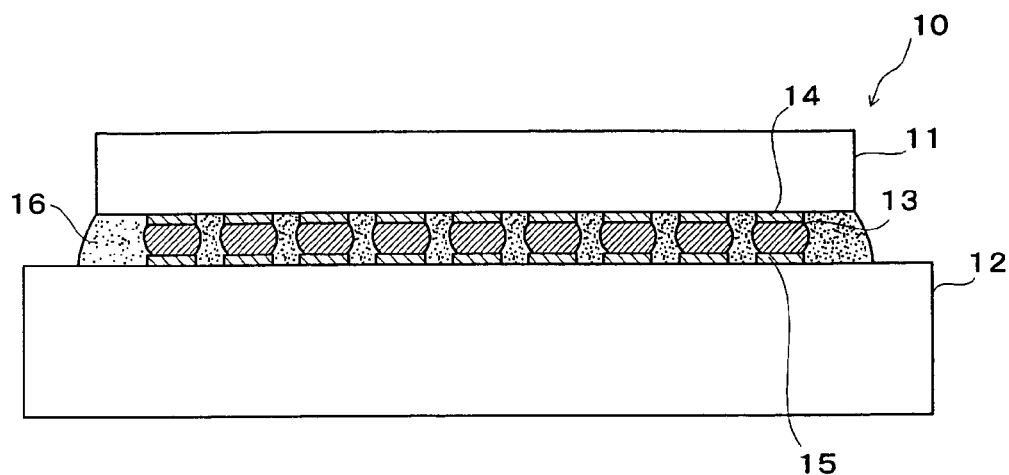
FIG. 1 is a view showing a schematic structure of the semiconductor device according to an embodiment of the present invention.

FIG. 1 is a sectional view showing a schematic structure of the semiconductor device according on an embodiment of the present invention. A semiconductor device (semiconductor module) 10 shown in FIG. 1 has a structure, in that a semiconductor element (semiconductor ship) 11 and a substrate 12 are electrically and mechanically connected by metal bumps such as solder bumps 13, namely a flip-chip connection structure. The individual solder bumps 13 are connected to first electrode pads 14 disposed on the semiconductor element 11 and second electrode pads 15 disposed on the substrate 12. As an underfill agent 16, a resin is filled to cure in a gap between the semiconductor element 11 and the substrate 12. For the underfill agent 16, epoxy-based resin, acrylic resin, amine-based resin, silicone resin, polyimide-based resin or the like is used.

Figure 2:
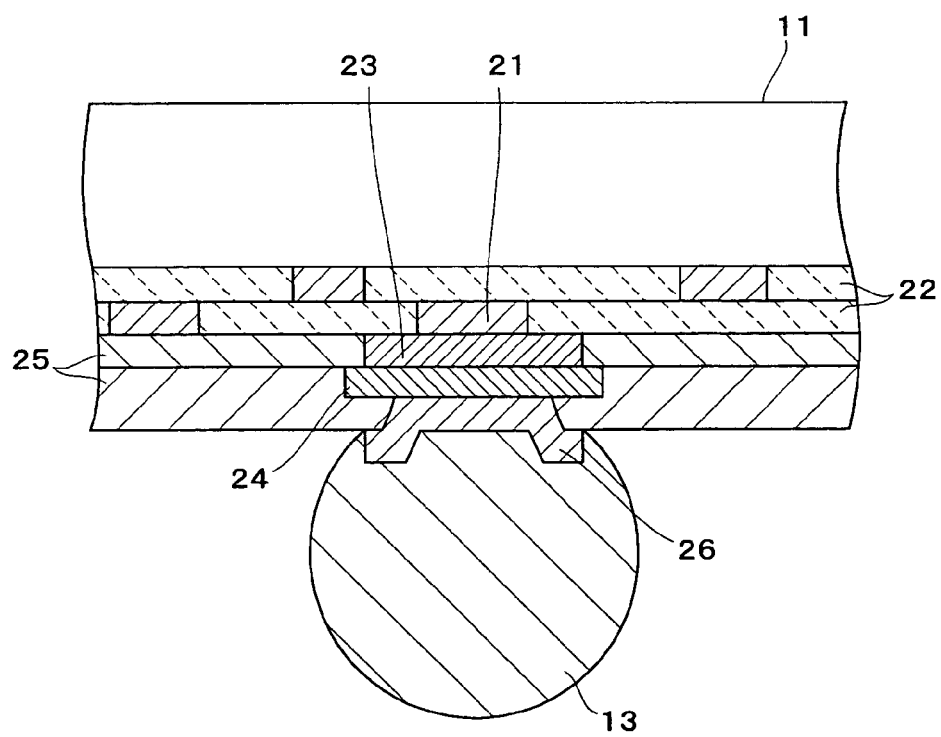
FIG. 2 is a view showing the structure of a main portion of the semiconductor element partly in section, which is applied to the semiconductor device shown in FIG. 1.
Figure 3:
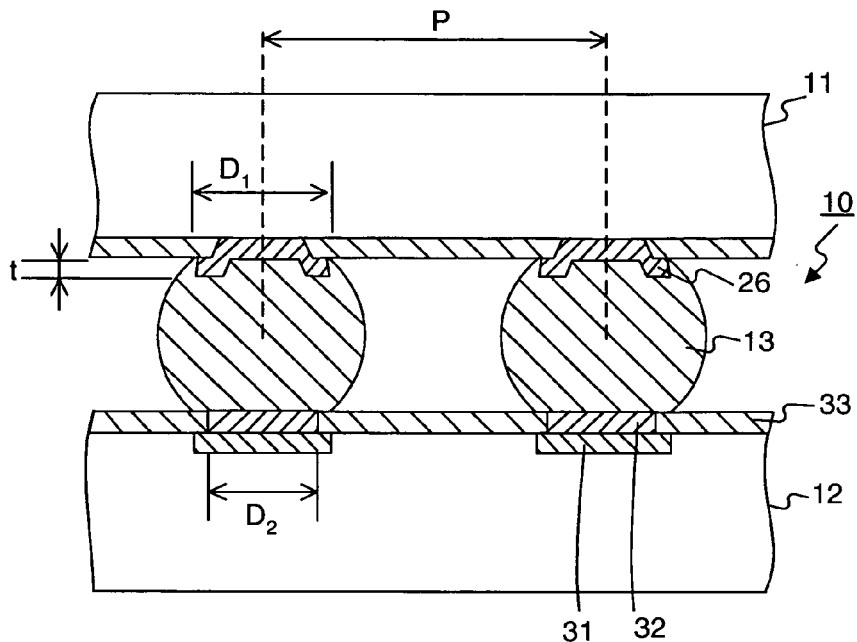
FIG. 3 is a view showing a connection structure partly in section of the semiconductor device shown in FIG. 1.

As shown in the magnified view of the main part of FIG. 2, the semiconductor element (element body) 11 has a circuit section configured of Cu wires 21 and low dielectric constant insulating films (low-k film) 22. FIG. 3 is a view showing a magnified image of the main part of the connected structure. For the low dielectric constant insulating films 22, a material having, for example, a specific inductive capacity of 3.5 or less is used. As the low dielectric constant insulating film 22, silicon oxide (SiOF) film doped with fluorine, silicon oxide (SiOC) film doped with carbon, organic-silica film, HSQ (hydrogen silsesquioxane) film, MSQ (methyl silsesquioxane) film, BCB (benzocyclobutene) film, PAE (polyarylether) film, PTFE (polytetrafluoroethylene) film, their porous films, porous silica film and the like are exemplified.

The low dielectric constant insulating film 22 contributes to reduction of capacitance between wires, speeding up of signal wires and provision of finer pitch based on the reduction of capacitance between wires but has disadvantages poor in mechanical strength and adhesion strength. For example, the adhesion strength between the low dielectric constant insulating films 22 or the adhesion strength of the low dielectric constant insulating film 22 to an Si chip, a metal film, an insulating film (SiO$_2$ film, Si$_3$N$_4$ film, etc.) is, for example, 15 J/m$^2$ or less. The low dielectric constant insulating film 22 tends to have a crack, peeling or the like produced in the film itself or from the stacked interface because of a stress or the like resulting from a difference in thermal expansion coefficient between the semiconductor element 11 and the substrate 12 as described above. Such a defect was a factor of lowering a production yield, degrading the reliability or the like of a conventional semiconductor device. The semiconductor device 10 of this embodiment is configured to retard the occurrence of a crack, peeling or the like resulting from the low dielectric constant insulating film 22.

A Cu pad 23 is formed on the individual Cu wires 21 of the semiconductor element 11, and an Al pad 24 is further formed on it. The individual electrode pads 14 of the semiconductor element 11 are configured of a laminated film of the Cu pad 23 and the Al pad 24. In FIG. 2, reference numeral 25 denotes a passivation film formed of SiO$_2$, Si$_3$N$_4$ or the like or an insulation resin layer formed of polyimide resin or the like. A barrier metal layer 26 is formed on the individual Al pads 24. The barrier metal layer 26 improves adhesiveness (wettability of solder) between the Al pads 24 and the solder bumps 13 and prevents the solder metal from dispersing into the electrode material for the semiconductor element 11.

Specific examples of the barrier metal layer 26 include a laminated film having a Ti film/Cu film/Ni film structure laminated sequentially from the Al pad 24, a laminated film having a Ti film/Ni film/Pd film structure, and the like. But, the barrier metal layer 26 is not limited to the above, and various metal films and metal laminated films can be applied according to the required characteristics. For example, Ti, Cr, Ta, Ni, Cu, Pd, Au, Al, TiN, TaN, a laminated film of them, a mixture of them, a compound of them and the like can be applied to the barrier metal layer 26 according to the required characteristics.

The solder bumps 13 are formed on the electrode pads 14 (specifically, the Al pads 24) on the side of the semiconductor element 11 via the above-described barrier metal layers 26. To comply with the multiplication of pins, the solder bumps 13 are arranged in matrix within, for example, a prescribed area. Those solder bumps 13 are formed by an electrolytic plating method or the like. The solder bumps 13 are typically formed by covering the surface of the semiconductor element 11 with a pattern of a resist excepting the areas where the solder bumps 13 are formed and performing electrolytic plating with the barrier metal layer 26 used as a negative electrode. At this time, the barrier metal layer 26 is previously formed on the entire surface of the semiconductor element 11 and used as the negative electrode, and etching is performed after the electrolytic plating to pattern into a prescribed shape.

As a material configuring the solder bumps 13, a general solder material, Sn—Pb eutectic solder, can be used. But, the above-described lead is demanded to be reduced in used amount considering a load to environments, effects on human bodies, and the like. Therefore, it is desirable to use a nonlead type solder material (Pb-free solder) which is substantially free from lead. Examples of the Pb-free solder include an alloy, a mixture, a compound or the like of Sn and one or two or more elements selected from Ag, Au, Cu, Bi, Sb, In, Zn and Ge. Pb-free solder other than the Sn-based one may be used. Examples of the typical Pb-free solder include Sn—Ag type solder, Sn—Ag—Cu type solder, Sn—Bi type solder, Sn—Bi—Ag—Cu type solder and the like.

Here, an application of the solder bumps 13 to the metal bumps will be described mainly. The metal bumps which connect the semiconductor element 11 and the substrate 12 are not limited to the solder bumps. For example, the metal bumps formed of Au, Ag, Cu, Ni, Fe, Pd, Sn, Pb, Bi, Zn, In, Su, Ge, a mixture or a compound of them can also be applied to the connection of the semiconductor element 11 and the substrate 12.

For the substrate 12 on which the semiconductor element 11 is mounted, the substrates formed of various types of materials, such as a resin substrate, a ceramics substrate, a glass substrate, an Si substrate or the like, can be applied. As the resin substrate, a general multilayer copper-clad laminated plate (multilayer printed circuit board) or the like is used. The electrode pads 15 are formed on the surface of the substrate 12 at positions corresponding to those of the solder bumps 13. The substrate 12 has Cu wires 31 as shown in a magnified image of the main part of the connection structure of FIG. 3, and Cu pads 32 are formed as the electrode pads 15 at the connection points of the Cu wires 31. The surface of the substrate 12 excepting the portions of the Cu pads 32 is covered with a solder resist 33. It is desirable to form, for example, an Au film, a solder film or the like on the surface of the Cu pads 32 in view of solder wettability, corrosion resistance and the like. For the electrode pads 15 on the side of the substrate 12, not only Cu but also various types of metal materials can be applied.

The solder bumps 13 which are formed on the Al pads 24 (the electrode pads 14) of the side of the above-described semiconductor element 11 via the barrier metal layer 26 are connected mechanically and electrically to the Cu pads 32 (electrode pads 15) of the substrate 12 by connecting the semiconductor element 11 to the substrate 12 by flip-chip connection. Thus, the semiconductor device (semiconductor module) 10 which has the semiconductor element 11 and the substrate 12 connected by the flip-chip connection. The solder bumps 13 are not limited to be formed on the side of the semiconduct or element 11. The solder bumps 13 may be formed on the Cu pads 32 (electrode pads 15) of the substrate 12. In either case, it is desired that the solder bumps 13 have a function to connect the semiconductor element 11 and the substrate 12.

In the semiconductor device 10 described above, the barrier metal layer 26 formed on the electrode pads 14 (Cu pads 23/Al pads 24) of the semiconductor element 11 has a thickness t in a range of 0.1 to 3 μm. The barrier metal layer 26 having a thickness t in a range of 0.1 to 3 μm contributes to suppression of the occurrence of a crack, peeling or the like resulting from the low dielectric constant insulating film 22. The film thickness t of the barrier metal layer 26 here indicates a total thickness of the individual films when the above-described laminated film of the Ti film/Cu film/Ni film, the Ti film/Ni film/Pd film or the like is used. And, the film thickness t of the barrier metal layer 26 is measured by using, for example, a magnified picture of a cross section with the thickness of the vicinity of its outer region determined as a standard.

If the film thickness t of the barrier metal layer 26 is excessively large, its hardness causes an adverse effect, and a stress because of a difference in thermal expansion between the semiconductor element 11 and the substrate 12 is easily applied locally. This stress concentrates on the low dielectric constant insulating film 22 which is poor in mechanical strength to cause a crack, peeling or the like in the low dielectric constant insulating film 22 itself, the interface between the low dielectric constant insulating films 22, the interface between the low dielectric constant insulating film 22 and another layer, and the like. The crack, peeling or the like in the low dielectric constant insulating film 22 resulting from the film thickness t of the barrier metal layer 26 becomes conspicuous from a region having the film thickness t of exceeding 3 μm. Therefore, it is desired that the barrier metal layer 26 has the film thickness t of 3 μm or less.

Meanwhile, if the barrier metal layer 26 has a film thickness t of less than 0.1 μm, the intrinsic properties (barrier effect and the like of the solder metal) of the barrier metal layer 26 are lost soon, and a defective connection or the like occurs. This is a cause of degrading the properties of the semiconductor device 10. Therefore, it is desirable that the barrier metal layer 26 has a film thickness t of 0.1 μm or more. It is more desirable that the barrier metal layer 26 has a film thickness t in a range of 0.3 to 2 μm. By applying the barrier metal layer 26 having such a film thickness t, a crack, peeling or the like resulting from the low dielectric constant insulating film 22 can be retarded with a good reproducibility even if a Pb-free solder which has a melting point higher than that of the Sn—Pb eutectic solder and may become hard is used.

The barrier metal layer 26 has an effect of a crack, peeling or the like to the low dielectric constant insulating film 22 depending on not only its film thickness t but also the shape of a portion in contact with the solder bumps 13. Specifically, a diameter (maximum diameter of a portion in contact with the solder bumps 13) $D_1$ of the barrier metal layer 26 has an effect on the crack, peeling or the like of the low dielectric constant insulating film 22 in view of a relationship with an opening diameter (maximum diameter of a portion exposed to the surface) $D_2$ of the electrode pads 15 (Cu pads 32) on the side of the substrate 12 and a minimum pitch p of the solder bumps 13. Therefore, it is desirable that the diameter $D_1$ of the barrier metal layer 26 is equal to or larger ($D_1 \geq D_2$) than the opening diameter $D_2$ of the electrode pad 15 on the side of the substrate 12. Besides, the diameter $D_1$ [μm] of the barrier metal layer 26 desirably has a size in a range of 0.4 p to 0.7 p with respect to the minimum pitch p [μm] of the solder bumps 13.

Specifically, a stress applied toward the semiconductor element 11 is dispersed toward the substrate 12 by making the opening diameter $D_2$ of the electrode pads 15 on the side of the substrate 12 smaller than the diameter $D_1$ of the barrier metal layer 26. Thus, the stress applied to the low dielectric constant insulating film 22 is decreased, so that it becomes possible to retard the occurrence of a crack, peeling or the like. To obtain the dispersion effect of the stress with a good reproducibility, it is desirable that the diameter $D_1$ of the barrier metal layer 26 is made larger ($D_1 > D_2$) than the opening diameter $D_2$ of the electrode pad 15 on the side of the substrate 12.

It is desirable that the opening diameter $D_2$ of the electrode pad 15 on the side of the substrate 12 is made to be 90% or less of the diameter $D_1$ of the barrier metal layer 26, so that the above-described stress dispersion effect can be obtained more noticeably. But, if the opening diameter $D_2$ of the electrode pads 15 on the side of the substrate 12 is excessively small, there is a possibility of causing a defective connection or the like of the solder bumps 13. Therefore, it is desirably determined to be 50% or more of the diameter $D_1$ of the barrier metal layer 26. It is desirable that the barrier metal layer 26 has a specific diameter $D_1$ in a range of 50 to 400 μm, and more desirably in a range of 60 to 200 μm.

If the diameter $D_1$ of the barrier metal layer 26 becomes 0.4 p or less with respect to the minimum pitch p of the solder bumps 13, a stress applied to each of the solder bumps 13, namely a stress based on a thermal expansion difference between the semiconductor element 11 and the substrate 12, becomes large. Therefore, a crack, peeling or the like occurs easily in the low dielectric constant insulating film 22. Meanwhile, if the diameter $D_1$ of the barrier metal layer 26 exceeds 0.7 p with respect to the minimum pitch p of the solder bumps 13, an effect of easing a stress because of a thermal expansion difference between the semiconductor element 11 and the substrate 12 is improved, but a short circuit occurs easily between the neighboring solder bumps 13, and a rate of defect incidence is increased by the short circuit between the solder bumps 13.

Therefore, it is desirable that the diameter $D_1$ [μm] of the barrier metal layer 26 is in a range of 0.4 p to 0.7 p with respect to the minimum pitch p [μm] of the solder bumps 13. It is more desirable that the diameter $D_1$ of the barrier metal layer 26 is in a range of 0.475 p to 0.65 p, and more desirably in a range of 0.55 p to 0.65 p. It is more desirable that the diameter $D_1$ of the barrier metal layer 26 satisfies both a relationship of $D_1 \geq D_2$ (also $D_1 > D_2$) and a relationship of $D_1 = 0.4$ p to 0.7 p.

The semiconductor device 10 of the above-described embodiment eases the stress resulting from the thermal expansion difference between the semiconductor element 11 and the substrate 12 by virtue of the film thickness t and the diameter $D_1$ of the barrier metal layer 26. Therefore, where the semiconductor element 11 having the low dielectric constant insulating film 22 with a low mechanical strength is applied, a crack, peeling or the like due to the low dielectric constant insulating film 22 can be retarded from occurring. Thus, a rate of defect incidence in the process of manufacturing the semiconductor device 10 (flip-chip connection step or the like) can be retarded considerably. In addition, it becomes possible to enhance reliability in actual use. Especially, even when the solder bumps 13 are formed of Pb-free solder which has a melting point higher than that of the Sn—Pb eutectic solder and may become hard, a crack, peeling or the like resulting from the low dielectric constant insulating film 22 can be retarded with a good reproducibility.

In the semiconductor device 10 of this embodiment, an incidence of a crack, peeling or the like in the low dielectric constant insulating film 22 is decreased by satisfying one of the control of the film thickness t of the barrier metal layer 26, the control of the diameter $D_1$ of the barrier metal layer 26 in relationship with the opening diameter $D_2$ of the electrode pad 15 and the control of the diameter $D_1$ of the barrier metal layer 26 in relationship with the minimum pitch p of the solder bumps 13. It is desirable that the control of the film thickness t the barrier metal layer 26 and the control of the diameter $D_1$ are performed at the same time. It is desirable that the barrier metal layer 26 has the film thickness t in a range of 0.1 to 3 μm and has the diameter $D_1$ satisfying at least one of conditions $D_1 \geq D_2$ (especially, $D_1 > D_2$) and $D_1 = 0.4$ p to 0.7 p. Especially, it is desirable to satisfy all three conditions.

The semiconductor device 10 of the above-described embodiment is produced through individual steps of flip-chip connecting the semiconductor element 11 and he substrate 12, washing a flux agent and filling to cure the underfill agent 16 between the semiconductor element 11 and the substrate 12. In addition to such a production process, it is also possible to apply, for example, a sealing method which uses a no flow underfill agent not using a flux agent.

Then, specific examples of the present invention and results of their evaluation will be described.

EXAMPLE 1

First, a semiconductor wafer (Si wafer: 8 inches, thickness of 725 μm) having a Cu wire and an SiOC film as a low dielectric constant insulating film was provided. Al pads were formed on Cu pads of the semiconductor wafer, and a Ti film, an Ni film and a Pd film were sequentially laminated on the entire surface of the wafer to form a barrier metal layer. It was determined that the barrier metal layer had eight kinds of film thicknesses t of 0.03 μm, 0.05 μm, 0.1 μm, 0.5 μm, 1 μm, 3 μm, 5 μm and 10 μm as the overall thickness of the laminated film. And, the barrier metal layers each having the above thicknesses t were formed.

Then, a resist was applied onto the barrier metal layer to form a film having a thickness of about 50 μm, and openings of 100 μm squares were formed in the resist so as to overlap the Al pads. Low melting point metal for forming the solder bumps was coated on the openings in thickness of 50 μm by electrolytic plating. For example, where the Sn—Pb eutectic solder was used, the semiconductor wafer having the resist pattern was immersed in a plating bath which contains Sn 30 g/L, Pb 20 g/L and alkane sulfonic acid 100 g/L and an additive mainly consisting of a surface-active agent. The electrolytic plating was performed wile gently stirring under conditions that a bath temperature was 20° C., the barrier metal layer was a negative electrode, an Sn—Pb plate was a positive electrode and a current density was 1 A/dm².

Then, the resist pattern was peeled by using a solvent such as acetone, a peeling liquid or the like, and a Ti/Ni/Pd laminated film as the barrier metal layer was etched into a desired pattern. For etching the Pd film and the Ni film, an aqua regia based etching solution was used. For etching the Ti film, an ethylene diamine tetra-acetic acid-based etching solution was used. Lastly, flux was applied to the semiconductor wafer, and it was heated in a nitrogen atmosphere at 220° C. for 30 seconds to reflow the solder metal (Sn—Pb eutectic solder). Thus, the semiconductor element having the solder bumps was electrically tested, and the semiconductor wafer was diced to form the semiconductor element.

Then, the above-described semiconductor element was flip-chip mounted on the individual substrates. Specifically, an appropriate amount of flux was applied to the solder bumps of the semiconductor element. A rosin based flux, water soluble flux or the like can be used. Then, the electrode pads of the substrate and the solder bumps of the semiconductor element were aligned and compressed for temporary fixation under conditions of 1 kg and 2 seconds. The temporarily fixed part was flown into a reflow furnace to connect the solder bumps and the electrode pads on the side of the substrate. The reflow temperature was 230° C. at a peak. Then, the flux was washed with a cleaning fluid of an organic solvent type, and epoxy resin was filled to cure between the semiconductor element and the substrate to produce a target semiconductor device.

Figure 4:
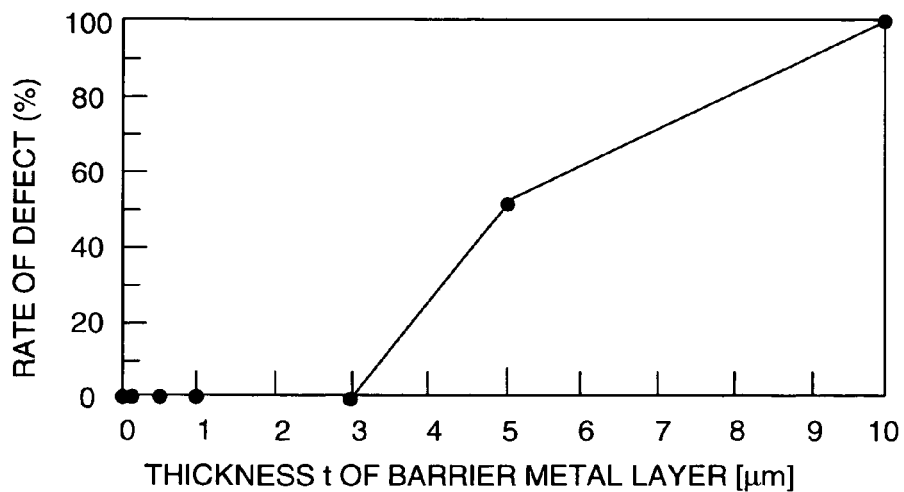
FIG. 4 is a view showing a relationship between film thickness t of a barrier metal layer and a rate of defect (a rate of defect incidence due to peeling or the like of a low dielectric constant insulating film) in Example 1 of the present invention.

The individual semiconductor devices obtained had the barrier metal layer with film thickness t of 0.03 μm, 0.05 μm, 0.1 μm, 0.5 μm, 1 μm, 3 μm, 5 μm and 10 μm as described above. The individual semiconductor devices were observed for the conditions of the low dielectric constant insulating film (SiOC film) below the solder bumps through an ultrasonic microscope. The results are shown in FIG. 4. It is apparent from FIG. 4 that samples of the barrier metal layers having film thicknesses t of 0.03 μm, 0.05 μm, 0.1 μm, 0.5 μm, 1 μm and 3 μm did not have a defect resulting from a crack or peeling. Meanwhile, samples of the barrier metal layers having film thicknesses t of 5 μm and 10 μm had a defect resulting from peeling of the low dielectric constant insulating film. It is seen from the results that the barrier metal layer is desired to have a film thickness t of 3 μm or less.

Then, the individual semiconductor devices produced under the same conditions as the above-described production conditions were subjected to a temperature cycling test, and their reliability was measured and evaluated. A 15-mm square chip on which 2500 solder bumps were formed was used as the semiconductor element and mounted on the resin substrate to prepare samples. The temperature cycling test was performed with −55° C.×30 min+25° C.×5 min+125° C.×30 min determined as one cycle. As a result, after 1000 cycles of temperature cycling test, the individual samples of the barrier metal layers having the film thicknesses t of 0.03 μm and 0.05 μM were found that the solder bumps in the vicinity of the barrier metal layer had a crack and a defective connection. Meanwhile, the individual samples of the barrier metal layers having the film thicknesses t of 0.1 μm, 0.5 μm, 1 μm and 3 μm were found no occurrence of rupture at all. Besides, there was no peeling of the low dielectric constant insulating film in the semiconductor element.

Figure 5:
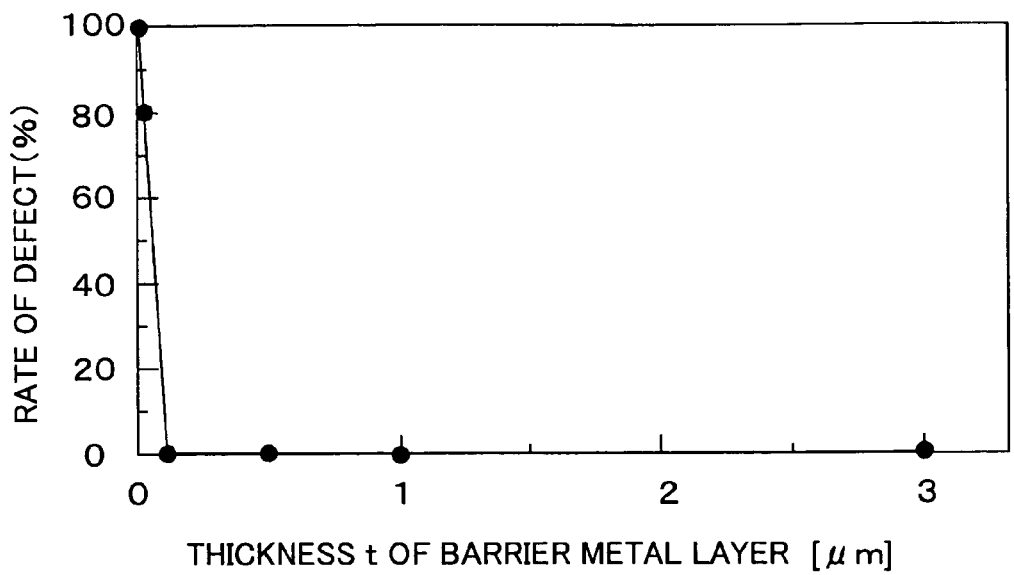
FIG. 5 is a view showing a relationship between film thickness t of a barrier metal layer and a rate of defect (a rate of defect incidence due to a decrease in function of barrier metal layer) in Example 1 of the present invention.

The above-described individual semiconductor devices were left standing under the high-temperature conditions (150° C.×1000 hr) and evaluated for reliability. The results are shown in FIG. 5. It is apparent from FIG. 5 that samples of the barrier metal layers having the film thicknesses t of 0.03 μm and 0.05 μM had a defective connection. It was because if the barrier metal layer was thin, Sn in the solder bumps dispersed quickly, and the function as the barrier metal layer was lost. It is apparent from the results that, when the barrier metal layer is determined to have a thickness t in a range of 0.1 μm or more and 3 μm or less, the low dielectric constant insulating film is free from peeling or a crack, and a semiconductor device having good reliability can be provided.

EXAMPLE 2

The same semiconductor wafer as that used in Example 1 was used to form Al pads and a barrier metal layer. The barrier metal layer had a Ti film having a thickness of 0.2 μm and a Cu film having a thickness of 0.5 μm sequentially laminated on the entire surface of the wafer. Then, a resist was coated onto the Cu film to form a film having a thickness of about 50 μm, and 100-μm square openings were formed in the resist so as to overlap the Al pads. An Ni film having a thickness of 2 μm was formed on the openings by the plating method. The barrier metal layer had a laminated film structure of Ti film/Cu film/Ni film, and the overall thickness of the laminated film was 2.7 μm.

Then, Low melting point metal was coated on the resist openings in thickness of 50 μm by electrolytic plating. For example, where the Sn—Ag solder was used, the semiconductor wafer having the resist pattern was immersed in a plating bath which contains Sn 30 g/L, Ag 20 g/L and alkane sulfonic acid 100 g/L and an additive mainly consisting of a surface-active agent. The electrolytic plating was performed wile gently stirring under conditions that a bath temperature was 20° C., the barrier metal layer was a negative electrode, an Sn plate was a positive electrode and a current density was 1 $A/dm^2$.

Subsequently, the resist pattern was peeled by using a solvent such as acetone, a peeling liquid or the like, and the Ti/Cu laminated film in the barrier metal layer was etched into a desired pattern. For etching the Cu film, a citric acid-based etching solution was used. For etching the Ti film, an ethylene diamine tetra-acetic acid-based etching solution was used. Lastly, flux was applied to the semiconductor wafer, and it was heated in a nitrogen atmosphere at 250° C. for 30 seconds to reflow the solder metal (Sn—Ag solder). Thus, the semiconductor element having the solder bumps was electrically tested, and the semiconductor wafer was diced to form a semiconductor element.

The above-described semiconductor element was flip-chip connected onto the resin substrate in the same way as in Example 1, and the epoxy resin was filled to cure between the chip and the substrate to produce a target semiconductor device. The conditions of the semiconductor device were observed through an ultrasonic microscope to find that the low dielectric constant insulating film (SiOC film) was free from a crack or peeling.

Besides, this semiconductor device was subjected to the temperature cycling test under the same conditions as in Example 1. As a result, it was found that there was no defective connection after the 1000 cycles, and the low dielectric constant insulating film within the semiconductor element was free from peeling or a crack. The semiconductor device was left standing under a high-temperature condition for evaluation of reliability. It was found that there was no defective connection after the high-temperature exposure under 150° C.×1000 hr. It was found from the results that, even when a Pb-free solder was applied for the solder bumps, a rate of defect incidence was low during the production, and a semiconductor device with good reliability could be provided.

EXAMPLE 3

Plural semiconductor elements were produced under the same conditions as those in Example 2 and flip-chip connected onto the resin substrate to produce semiconductor devices. At that time, a minimum pitch p of the solder bumps was kept constant at 200 μm, and the diameter $D_1$ of the barrier metal layer was varied in a range of 0.2 p to 0.9 p with respect to the bump pitch p (200 μm). In the process of manufacturing the individual semiconductor devices having the semiconductor elements with a different diameter $D_1$ of the barrier metal layer, a rate of defect incidence because of peeling of the low dielectric constant insulating film and a rate of defect incidence because of a short circuit between the bumps were examined. The rate of defect incidence because of peeling of the low dielectric constant insulating film is shown in FIG. 6, and the rate of defect incidence because of a short circuit between the bumps is shown in FIG. 7.

Figure 6:
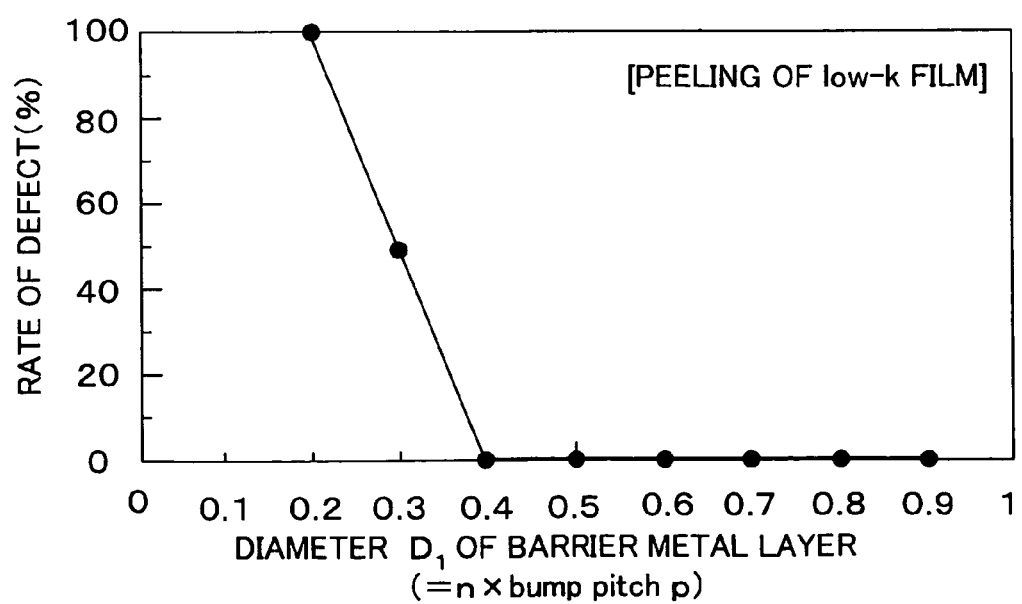
FIG. 6 is a view showing a relationship between a diameter $D_1$ of the barrier metal layer and a rate of defect (a rate of defect incidence due to peeling or the like of the low dielectric constant insulating film) in Example 3 of the present invention.
Figure 7:
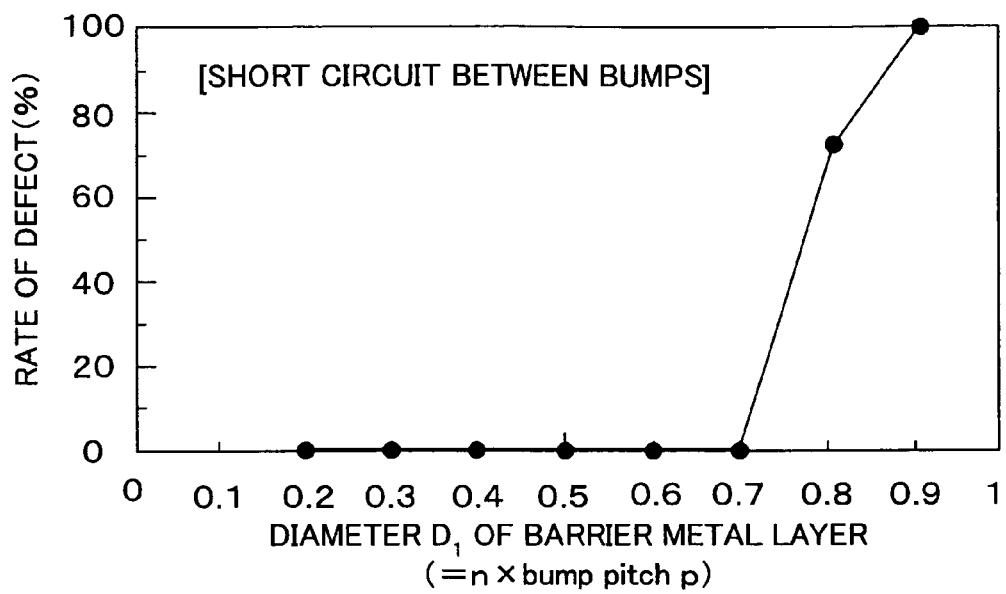
FIG. 7 is a view showing a relationship between a diameter $D_1$ of the barrier metal layer and a rate of defect (a rate of defect incidence because of a short circuit between bumps) in Example 3 of the present invention.

It is apparent from FIG. 6 that, when the barrier metal layer is determined to have a diameter $D_1$ of 0.4 p or more (80 μm or more) against the bump pitch p (200 μm), peeling of the low dielectric constant insulating film can be retarded. It is seen from FIG. 7 that a short circuit between the bumps can be retarded by determining the diameter $D_1$ of barrier metal layer to 0.7 p or less (140 μm or less) with respect to the bump pitch p (200 μm).

The semiconductor devices using a semiconductor element having the diameter $D_1$ of the barrier metal layer in a range of 0.4 p to 0.7 p with respect to the bump pitch p had a good temperature cycle property. It is apparent from the results that the diameter $D_1$ of the barrier metal layer is determined to fall in a range of 0.4 p to 0.7 p with respect to the bump pitch p, so that the semiconductor device which is free from peeling or a crack in the low dielectric constant insulating film and has good reliability can be provided.

EXAMPLE 4

Figure 8:
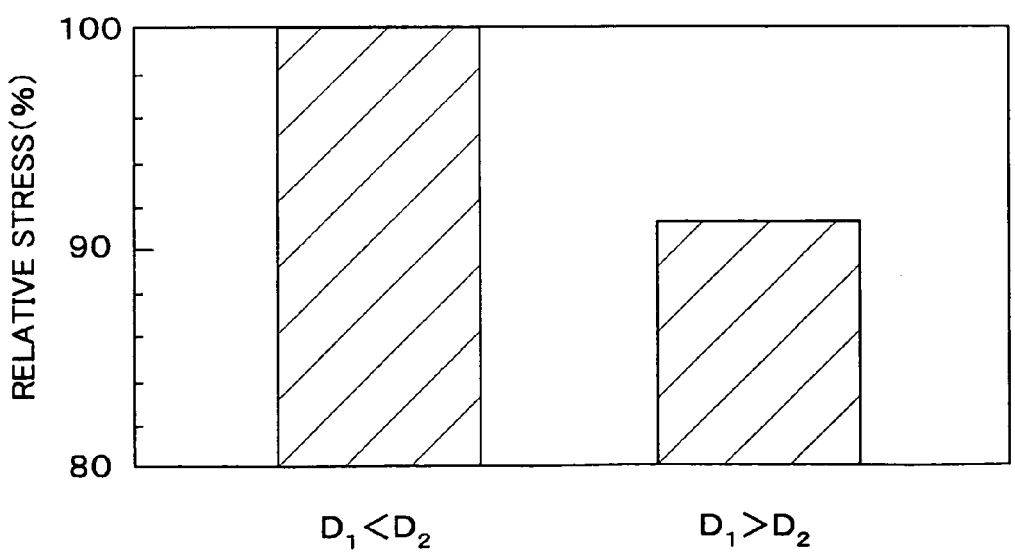
FIG. 8 is a view showing an example of a stress applied to the low dielectric constant insulating film of the semiconductor device in Example 4 of the present invention in comparison with a conventional semiconductor device.

Plural semiconductor elements were produced under the same conditions as those in Example 2 and flip-chip connected onto the resin substrate to produce semiconductor devices. At that time, the diameter $D_1$ of the barrier metal layer was kept constant to 120 μm, and the opening diameter $D_2$ of the electrode pads on the side of the substrate was varied in a range of 90 to 125 μm. The individual semiconductor devices using the substrates having a difference in the opening diameter $D_2$ of the electrode pads were evaluated for a stress applied to the low dielectric constant insulating film. The results are shown in FIG. 8. Specific opening diameter $D_2$ of the electrode pads with an example of $D_1<D_2$ of FIG. 8 is 125 μm, and specific opening diameter $D_2$ of the electrode pads with an example of $D_1>D_2$ is 90 μm. The stress shown in FIG. 8 has a relative value when it is assumed that the example of $D_1<D_2$ is 100%.

As apparent from FIG. 8, when the diameter $D_1$ of the barrier metal layer is determined to be larger than opening diameter $D_2$ of the electrode pads ($D_1>D_2$), a stress applied to the low dielectric constant insulating film can be reduced. Thus, the occurrence of a crack or peeling can be retarded. The semiconductor device using the semiconductor element having the diameter $D_1$ ($>D_2$) of the barrier metal layer was subjected to the temperature cycle test and the high-temperature exposure test, and the obtained results were good.

Besides, the semiconductor devices with the opening diameter $D_2$ of the electrode pads on the side of the substrate varied were subjected to the temperature cycling test. It was found that when the opening diameter $D_2$ of the electrode pads was specially in a range of 0.5 $D_1$ to 0.9 $D_1$, remarkable reliability could be obtained. It is apparent from the results that the diameter $D_1$ of the barrier metal layer is determined to be smaller than (or equal to) the opening diameter $D_2$ of the electrode pad, so that the occurrence of peeling or a crack in the low dielectric constant insulating film is retarded, and a semiconductor device with good reliability can be provided.

The present invention is not limited to the specific embodiments thereof illustrated herein but also applied to various types of semiconductor devices, which have the semiconductor element flip-chip connected, and their manufacturing methods. It is to be understood that various modifications may be made without deviating from the spirit and scope of the present invention, and such semiconductor devices and their manufacturing methods are also included in the present invention.

What is claimed is:

1. A semiconductor device, comprising:
a semiconductor element having an element body that comprises (i) a low dielectric constant insulating film having a specific inductive capacity of 3.5 or less and (ii) conductor wires embedded in the low dielectric constant insulating film, first electrode pads disposed on the conductor wires of the element body, and barrier metal layers formed on the first electrode pads and having a thickness in a range of 0.1 to 3 μm;
metal bumps connected to the first electrode pads via the barrier metal layers; and a substrate having second electrode pads which are connected to the first electrode pads via the metal bumps.

2. The semiconductor device according to claim 1, wherein a diameter $D_1$ of the barrier metal layers and an opening diameter $D_2$ of the second electrode pads satisfy a relationship of $D_1 > D_2$.

3. The semiconductor device according to claim 1, wherein a diameter $D_1$ of the barrier metal layers and a minimum pitch p of the metal bumps satisfy a relationship of $D_1 = 0.4$ p to 0.7 p.

4. The semiconductor device according to claim 1, wherein a diameter $D_1$ of the barrier metal layers, an opening diameter $D_2$ of the second electrode pads and a minimum pitch p of the metal bumps satisfy relationships of $D_1 > D_2$ and $D_1 = 0.4$ p to 0.7 p.

5. The semiconductor device according to claim 1, wherein the metal bumps are formed of a nonlead solder material substantially not containing lead.

6. A semiconductor device, comprising:
a semiconductor element having an element body that comprises (i) a low dielectric constant insulating film having a specific inductive capacity of 3.5 or less and (ii) conductor wires embedded in the low dielectric constant insulating film, first electrode pads disposed on the conductor wires of the element body, and barrier metal layers formed on the first electrode pads and having a diameter $D_1$;
metal bumps connected to the first electrode pads via the barrier metal layers; and
a substrate having second electrode pads which are connected to the first electrode pads via the metal bumps and have an opening diameter $D_2$,
wherein the diameter $D_1$ satisfies a relationship of $D_1 > D_2$.

7. The semiconductor device according to claim 6, wherein the second electrode pads have the opening diameter $D_2$ satisfying a relationship of $0.5 D_1 \leq D_2 \leq 0.9 D_1$.

8. The semiconductor device according to claim 6, wherein a minimum pitch p of the metal bumps satisfies a relationship of $D_1 = 0.4$ p to 0.7 p.

9. The semiconductor device according to claim 6, wherein the metal bumps are formed of a nonlead solder material substantially not containing lead.

10. A semiconductor device, comprising:
a semiconductor element having an element body that comprises (i) a low dielectric constant insulating film having a specific inductive capacity of 3.5 or less and (ii) conductor wires embedded in the low dielectric constant insulating film, first electrode pads disposed on the conductor wires of the element body, and barrier metal layers formed on the first electrode pads and having a diameter $D_1$;
metal bumps connected to the first electrode pads via the barrier metal layers, and having a minimum pitch p; and
a substrate having second electrode pads which are connected to the first electrode pads via the metal bumps,
wherein the diameter $D_1$ satisfies a relationship of $D_1 = 0.4$ p to 0.7 p.

11. The semiconductor device according to claim 10, wherein the metal bumps are formed of a nonlead solder material substantially not containing lead.

* * * * *